(12) United States Patent
Lin

(10) Patent No.: US 8,519,876 B2
(45) Date of Patent: Aug. 27, 2013

(54) ANALOG-TO-DIGITAL CONVERTER (ADC) AND COMPARATOR UNIT THEREOF

(75) Inventor: Zhi-Ming Lin, Changhua (TW)

(73) Assignee: National Changhua University of Education, Changhua (TW)

( * ) Notice: Subject to any disclaimer, the term of this patent is extended or adjusted under 35 U.S.C. 154(b) by 0 days.

(21) Appl. No.: 13/431,955

(22) Filed: Mar. 27, 2012

(65) Prior Publication Data

US 2012/0319882 A1  Dec. 20, 2012

(30) Foreign Application Priority Data

Jun. 16, 2011 (TW) .............................. 100121076 A

(51) Int. Cl.
*H03M 1/00* (2006.01)
(52) U.S. Cl.
USPC .......................................... 341/136; 341/155

(58) Field of Classification Search
USPC ................. 341/136, 155, 156, 166, 172, 124; 327/81, 108, 165, 96
See application file for complete search history.

(56) References Cited

U.S. PATENT DOCUMENTS

2007/0096970 A1* 5/2007 Li et al. ......................... 341/155

\* cited by examiner

*Primary Examiner* — Joseph Lauture
(74) *Attorney, Agent, or Firm* — CKC & Partners Co., Ltd.

(57) ABSTRACT

An ADC with comparing circuit units is provided. Each comparing circuit unit comprises a first resistor, a second resistor, and a CMOS. The first and second resistors provide first and second level voltages, respectively. The base of the PMOS is electrically connected to the power source and the base of the NMOS is connected to the source of the NMOS. The signal input port is located at the gate of the CMOS and receives an analog signal. The first level port of the CMOS is located at the source of the NMOS and receives the first level voltage. The second level port of the CMOS is located at the source of the PMOS and receives the second level voltage. The signal output port of the CMOS is located at the drain and outputs a digital signal.

7 Claims, 7 Drawing Sheets

ANALOG-TO-DIGITAL CONVERTER (ADC) AND COMPARATOR UNIT THEREOF

RELATED APPLICATIONS

The application claims priority to Taiwan Application Serial Number 100121076, filed Jun. 16, 2011, which is herein incorporated by reference.

BACKGROUND

1. Field of Invention

The present invention relates to an analog-to-digital converter. More particularly, the present invention relates to a flash analog-to-digital converter.

2. Description of Related Art

FIG. 1 shows the basic structure of a conventional flash analog-to-digital converter (ADC). The conventional flash ADC operates by comparing an analog input signal Vin with reference voltages by using multiple comparators 110, then synthesizing the compared results to output an N-bit digital output signal $V_{out}$ by using a thermometer code encoder 120. The reference voltage of each comparator is obtained by dividing a reference voltage (between Vref+ and Vref−) using series resistors.

Specifically, an N-bit ADC needs $2^n$ resistors and $2^n-1$ comparators, and the reference voltage (between Vref+ and Vref−) can be divided to $2^n$ different reference voltages by $2^n$ resistors so as to allow the analog input signal Vin to be compared with the reference voltages.

Each of the comparators generates a digital output voltage representing the logic "1" when the analog input signal is higher than the reference voltage. In contrast, each of the comparators generates a digital output voltage representing the logic "0" when the analog input signal is lower than the reference voltage. These 1s and 0s are referred to as thermometer codes. The $2^n-1$ thermometer codes are synthesized as an N-bit digital output signal by the thermometer code encoder.

As shown in FIG. 1, since the flash ADC does not need sample-and-hold circuits, a data output can be generated in every clock pulse. As a result, the flash ADC can easily achieve high speed conversion performance, and thus is frequently used in medium- and low-resolution applications, as well as high-speed applications. In particular, flash ADCs are used in hard disks, read/write interfaces of CD-ROM drives, and high speed receivers. However, the flash ADC needs many comparators (for example, an N-bit ADC needs $2^n-1$ comparators), and thus difficulties are encountered with respect to promoting resolution performance.

A comparator of the conventional flash ADC is shown in FIG. 2. With reference to FIG. 2, one comparator requires seven NMOSs (n-type metal-oxide-semiconductors) N1-N7 and seven PMOSs (p-type metal oxide semiconductors) P1-P7, that is, 14 transistors in total. Thus, this configuration not only increases the chip area but also increases power consumption.

If the conventional comparator in FIG. 2 is used, each comparator requires 14 transistors, and the N-bit flash ADC requires $14 \times (2^n-1)$ transistors in total. Thus, a typical 6-bit ADC requires 882 transistors while a typical 16-bit ADC requires almost one million transistors. In other words, if it is desired to increase the resolution of an ADC, quite a large circuit layout area is needed and a significant amount of power consumption will be involved. However, the cost of a chip escalates with an increased circuit layout area, and the increased power consumption results in unnecessary heat generation.

In view of the above, a traditional flash ADC with high resolution requires many comparators, and thus is associated with a huge layout area and high power consumption. Further, the precision of the traditional flash ADC is limited by the poor matching among the elements thereof.

Hence, a flash ADC that provides high speed and high resolution with to fewer transistors would be the optimum solution in the area of ADC technology, resulting in reduced circuit layout area, less power consumption, and lower cost.

SUMMARY

Hence, an aspect of the present invention is to provide a comparing circuit unit for an analog-to-digital converter. The comparing circuit unit comprises a first resistor, a second resistor, and a CMOS transistor. The first resistor is configured with one end electrically connected to a power source and the other end providing a first level voltage. The second resistor is configured with one end electrically connected to the power source and the other end providing a second level voltage. The CMOS transistor comprises a PMOS transistor and an NMOS transistor. The base of the PMOS transistor is electrically connected to the power source and the base of the NMOS transistor is connected with the source of the NMOS transistor. Specifically, the CMOS transistor comprises a signal input port, a first level port, a second level port, and a signal output port. The signal input port is located at the gate of the CMOS transistor and utilized for receiving an analog signal. The first level port is located at the source of the NMOS transistor and utilized for receiving the first level voltage. The second level port is located at the source of the PMOS transistor and utilized for receiving the second level voltage. The signal output port is located at the drain of the CMOS transistor and utilized for outputting a digital signal. The digital signal is generated based on results of comparing a gate-to-source voltage $V_{GS}$ of the NMOS transistor and a threshold voltage of the NMOS transistor.

According to an embodiment of the present invention, when the to gate-to-source voltage $V_{GS}$ of the NMOS transistor is greater than the threshold voltage of the NMOS transistor, the NMOS transistor is activated and a negative logic "1" of the digital signal is generated.

According to the embodiment of the present invention, when the gate-to-source voltage $V_{GS}$ of the NMOS transistor is smaller than the threshold is voltage of the NMOS transistor, the NMOS transistor is cut off and a negative logic "0" of the digital signal is generated.

Another aspect of the present invention is to provide an analog-to-digital converter (ADC). The ADC comprises an input signal interface, an output signal interface and the above-mentioned comparing circuit unit. The input signal interface is configured to receive an analog input signal. The output signal interface is configured to electrically connect with the output port of the comparing circuit unit and synthesize the digital signal to a digital output signal. More specifically, the absolute value of the first level voltage equals the absolute value of the source-to-base voltage $V_{SB}$ of the NMOS transistor, and a threshold voltage of the NMOS transistor is tunable by adjusting a resistance of the first resistor. The digital signal is generated based on results of comparing a gate-to-source voltage $V_{GS}$ of the NMOS transistor and the threshold voltage of the NMOS transistor.

According to another embodiment of the present invention, when the bits of the digital output signal is N, the number of the comparing circuit units is $2^n-1$.

According to the embodiment of the present invention, when the gate-to-source voltage $V_{GS}$ of the NMOS transistor is greater than the threshold voltage of the NMOS transistor, the NMOS transistor is activated and a negative to logic "1" of the digital signal is generated.

According to the embodiment of the present invention, when the gate-to-source voltage $V_{GS}$ of the NMOS transistor is smaller than the threshold voltage of the NMOS transistor, the NMOS transistor is cut off and a negative logic "0" of the digital signal is generated.

Thus, the above embodiments of the ADC and its comparing circuit unit can realize high-speed[o] and high-resolution operation with fewer transistors, and thus a smaller layout area on a chip and a lower cost for manufacturing may be achieved. Also, high power consumption and heat-dissipation problems may be avoided. Ultimately, high-speed and high-resolution performance can be achieved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
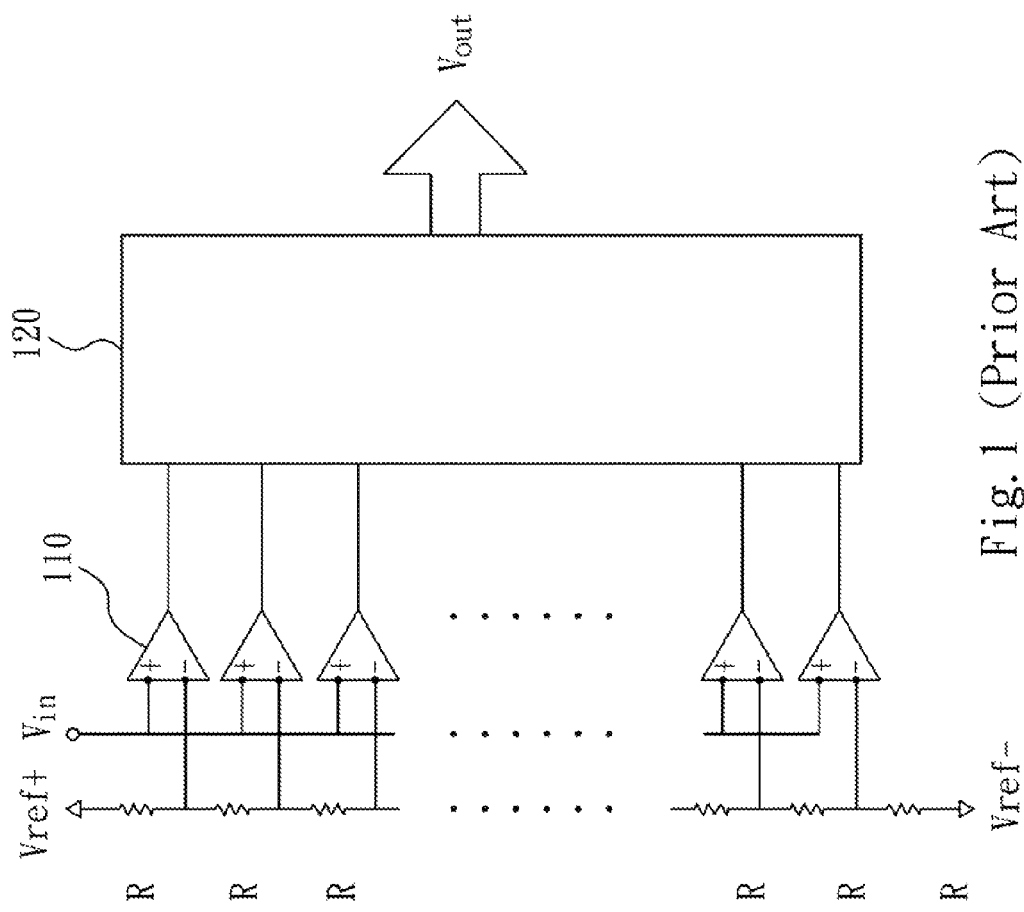
FIG. 1 is a schematic diagram of a conventional flash analog-to-digital converter (ADC)
Figure 2:
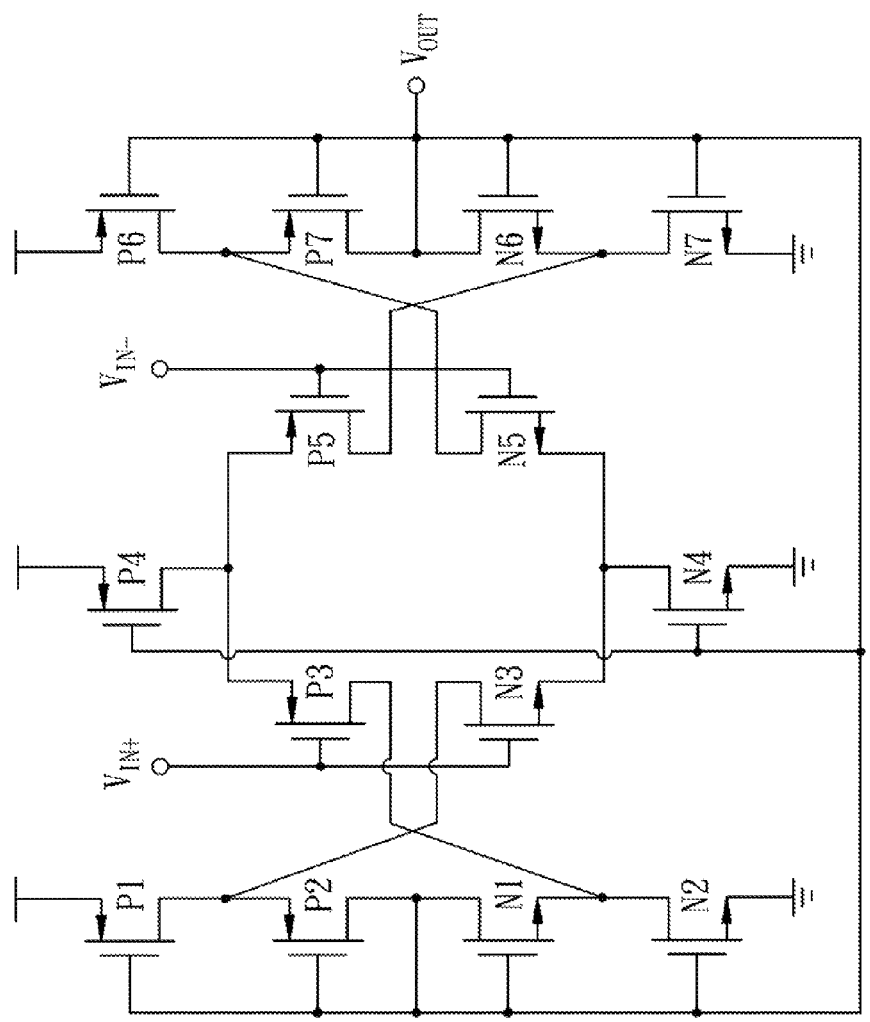
FIG. 2 is a schematic diagram of a conventional comparator of the ADC in FIG. 1.

Reference will now be made in detail to the present embodiments of the invention, examples of which are illustrated in the accompanying drawings. Wherever possible, the same reference numbers are used in the drawings and the description to refer to the same or like parts.

Figure 3:
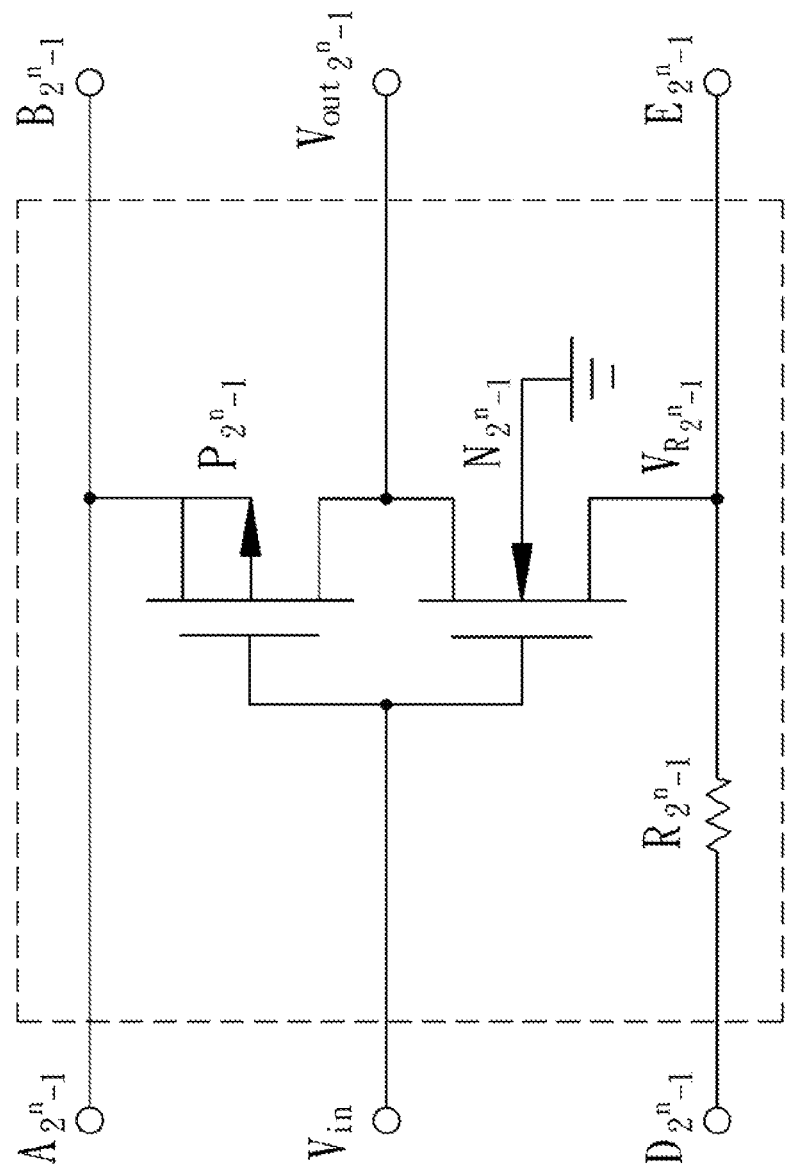
FIG. 3 is a schematic diagram of a comparing circuit unit in accordance to with the first embodiment of the present invention.

FIG. 3 shows a comparing circuit unit in accordance with the first embodiment of the present invention. The comparing circuit unit comprises a first resistor $R_2{}^n{}_{-1}$ and a CMOS (complementary metal-oxide-semiconductor) transistor. The first resistor $R_2{}^n{}_{-1}$ is configured with one end thereof electrically connected to a power source $V_{DD}$ or a bias source $V_{BIAS}$ (not shown in FIG. 3) and the other end thereof for providing a first level voltage $V_{R2}{}^n{}_{-1}$. The CMOS transistor includes a PMOS transistor $P_2{}^n{}_{-1}$ and an NMOS transistor $N_2{}^n{}_{-1}$. The base of the PMOS transistor is electrically connected to the power source $V_{DD}$ and the base of the NMOS transistor is connected to ground. Specifically, the CMOS transistor comprises a signal input port, a first level port, and a signal output port. The signal input port is located at the gate of the CMOS transistor and utilized for receiving an analog signal $V_{in}$. The first level port is located at the source of the NMOS transistor and utilized for receiving the first level voltage $V_{R2}{}^n{}_{-1}$. The signal output port is located at the drain of the CMOS transistor and utilized for outputting a digital signal $V_{out2}{}^n{}_{-1}$. The digital signal is generated based on results of comparing a gate-to-source voltage $V_{GS}$ of the NMOS transistor and a threshold voltage of the NMOS transistor.

In FIG. 3, the first level voltage $V_{R2}{}^n{}_{-1}$ is divided by the first resistor. It is known that a MOS transistor with a non-zero source-to-body voltage has a threshold voltage modified by the body effect. Therefore, because the base of the NMOS transistor is grounded and the source voltage of the NMOS transistor is $V_{R2}{}^n{}_{-1}$, i.e. $V_{R2}{}^n{}_{-1} - V_B = V_{SB} \neq 0$, the source voltage and the threshold voltage of the NMOS transistor is tunable by modifying the following body effect equation:

$$|V_{th}| = |V_{th0}| + |\gamma|(\sqrt{2\phi_f + |V_{SB}|} - \sqrt{2\phi_f}) \quad (1)$$

where $V_{TN}$ is the threshold voltage with substrate bias present, $V_{th0}$ is the zero-$V_{SB}$ value of threshold voltage. $\gamma$ is the body effect parameter, and $2\phi$ is the surface potential parameter. It is noted that $V_{SB}$ is under the square root symbol, and thus the variation between $V_{SB}$ and $V_{th}$ is non-linear.

Further, since $V_{R2}{}^n{}_{-1} - Vg = V_{SB} \neq 0$, the source voltage and the threshold voltage of the NMOS transistor is controllable by changing the resistance of the first resistor which causes the first level voltage. That is, if $|V_{R2}{}^n{}_{-1}|$ increases, then $|V_{SB}|$ also increases, and so does $|V_{th}|$.

The operation of the NMOS transistor is dependent on the gate-to-source voltage $V_{GS}$, which is equal to the differential of the analog input signal $V_{in}$ and the first level voltage $V_{R2}{}^n{}_{-1}$.

In detail, if the gate-to-source voltage $V_{GS}$ is smaller than the threshold is voltage $V_{th}$, the NMOS transistor is cut-off with no current, and the NMOS transistor is not conducted. The digital signal $V_{out2}{}^n{}_{-1}$ outputted from the NMOS transistor approximates with the power source $V_{DD}$, which is equivalent to a digital signal of negative logic "0." In this situation, $V_{in} - V_{R2}{}^n{}_{-1} = V_{GS} < V_{th}$, which is equivalent to $V_{in} < V_{th} + V_{R2}{}^n{}_{-1}$.

On the other hand, if the gate-to-source voltage $V_{GS}$ is greater than the threshold voltage $V_{th}$, the NMOS transistor is activated (conducted). The digital signal $V_{out2}{}^n{}_{-1}$ outputted from the NMOS transistor approximates with the ground, which is equivalent a negative logic "1" of the digital signal. In this situation, $V_{in} - V_{R2}{}^n{}_{-1} = V_{GS} > V_{th}$, which is equivalent to $V_{in} > V_{th} + V_{R2}{}^n{}_{-1}$.

$$\begin{cases} I_D = \frac{1}{2}\mu_n C_{ox} \frac{W}{L}\left[(V_{GS} - V_{th})V_{DS} - \frac{1}{2}V_{DS}^2\right] & \text{non-saturated} \\ I_D = \frac{1}{2}\mu_n C_{ox} \frac{W}{L}(V_{GS} - V_{th})^2 & \text{saturated} \end{cases} \quad (2)$$

$$V_{out} = V_S + I_D * R_{MOS}$$

When the gate-to-source voltage $V_{GS}$ is greater than the threshold voltage $V_{th}$, and the NMOS transistor is activated, the current $I_D$ can be calculated by the above equations.

The width of the NMOS transistor is related to the inner resistance $R_{MOS}$ of the NMOS transistor. That is, if the width of the NMOS transistor increases, the inner resistance $R_{MOS}$ is reduced. According to equation (2), the lower inner resistance $R_{MOS}$ can result in a lower output, and thus increase the range $V_{p-p}$ (the acceptable input range). However, the layout area on a chip is also enlarged when the width of the NMOS transistor is increased. The trade-off between the layout area and the inner resistance then becomes a very critical issue. It is possible to obtain optimum power consumption with adequate layout area by making adjustments. For example, if $V_{p-p}$ is sacrificed, the default minimum size of width may be used, such that the layout area and the power consumption can be reduced.

In addition, because an external resistance, such as the first resistor, is used to divide the power source, though the width-length ratio of every MOS transistor is set to be the same, the threshold voltage of each MOS transistor can be tuned by the external resistors. Further, the output voltage can also be tuned by calculating equation (2) and the switching time is under control.

Power savings may be realized by setting a different switching time of PMOS and NMOS transistors in such a manner that activating of both PMOS and NMOS transistors at the same time is avoided.

The output voltage $V_{out2}{}''_{-1}$ can form a thermometer code, and a to thermometer code decoder is used as an output signal interface and configured to be electrically connected to the output port of the comparing circuit unit and to synthesize the digital signal as a digital output signal. Thus, the source and the threshold voltage can be easily modified by a different resistance of $R_2{}''_{-1}$, such that the NMOS transistor can be used as a switch. Since the controllable $V_{SB}$ is under the square root, fine and accurate adjustments to resistance, $V_{SB}$ and $V_{th}$ are possible. As is evident from the above discussion, many different direct power supplies connected to the source of the NMOS transistor may realize the same result as the resistors for voltage division presented in this invention.

Figure 4:
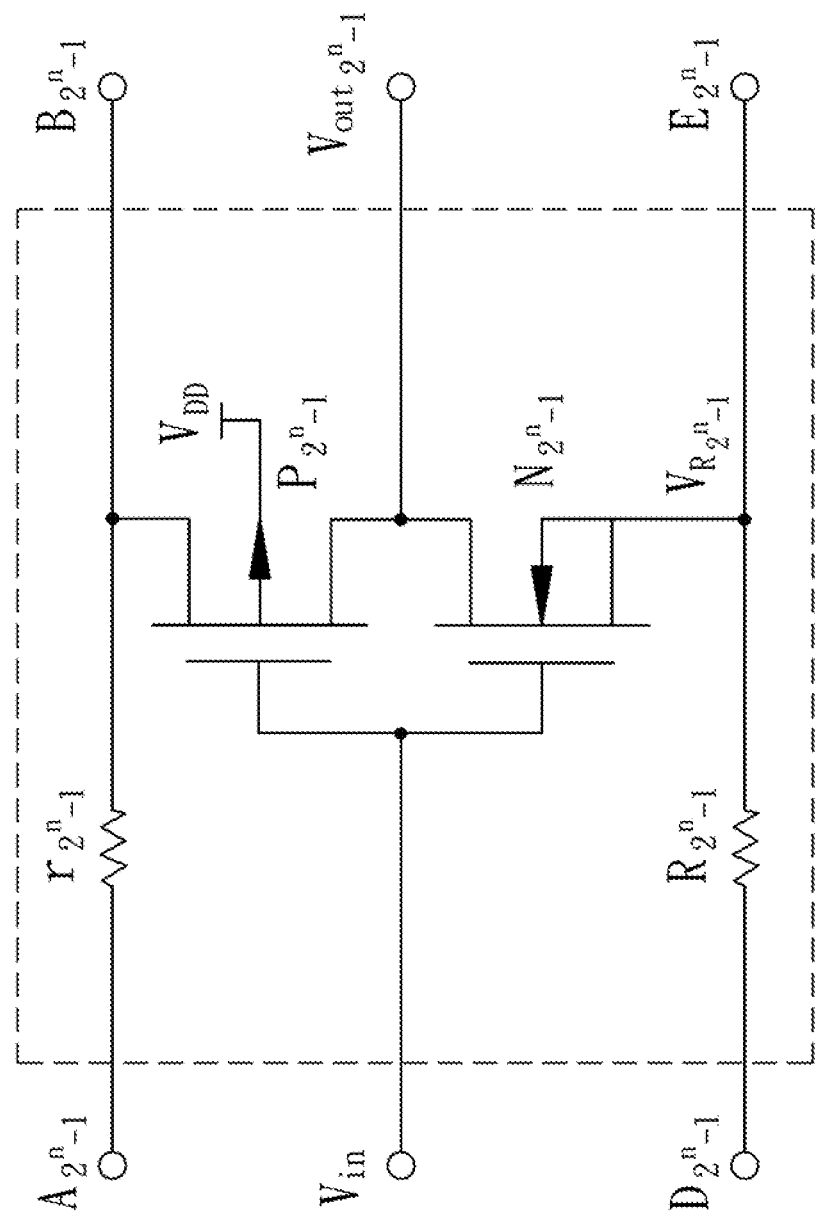
FIG. 4 is a schematic diagram of a comparing circuit unit in accordance with the second embodiment of the present invention.

FIG. 4 shows a comparing circuit unit in accordance with the second embodiment of the present invention. The comparing circuit unit comprises a first resistor $R_2{}''_{-1}$, a second resistor $r_2{}''_{-1}$, and a CMOS transistor. The first resistor $R_2{}''_{-1}$ is configured with one end thereof electrically connected with a power source $V_{DD}$ or a bias source $V_{BIAS}$ (not shown in FIG. 4) and the other end providing a first level voltage $V_{R2}{}''_{-1}$. The second resistor $r_2{}''_{-1}$ is configured with one end electrically connecting with the power source $V_{DD}$ and the other end providing a second level voltage $V_{r2}{}''_{-1}$. The CMOS transistor includes a PMOS transistor $P_2{}''_{-1}$ and an NMOS transistor $N_2{}''_{-1}$. The base of the PMOS transistor electrically connects with the power source $V_{DD}$ and the base of the NMOS transistor connects with the source of the NMOS transistor. Specifically, the CMOS transistor comprises a signal input port, a first level port, a second level port, and a signal output port. The signal input port is located at the gate of the CMOS transistor and utilized for receiving an analog signal $V_{in}$. The first level port is located at the source of the NMOS transistor and utilized for receiving the first level voltage $V_{R2}{}''_{-1}$. The second level port is located at the source of the PMOS transistor and utilized for receiving the second level voltage $V_{r2}{}''_{-1}$. The signal output port is located at the drain of the CMOS transistor and utilized for outputting a digital signal $V_{out2}{}''_{-1}$. The digital signal is generated based on results of comparing a gate-to-source voltage $V_{GS}$ of the NMOS transistor and a threshold voltage of the NMOS transistor.

The differences between the first and the second embodiments relate to the voltage between the source and base of the NMOS transistor and the presence of the second resistor at the source of the PMOS transistor. Therefore, the first resistor $R_2{}''_{-1}$ and the second resistor $r_2{}''_{-1}$ provide the first level voltage and the second level voltage, respectively.

In the second embodiment, the source of the NMOS transistor is connected with the base of the NMOS transistor and thus the threshold voltage $V_{th}=V_{th0}$. If $R_2{}^k{}_{-1}=r_2{}^k{}_{-1}$, k=1, 2, 3, 4 . . . n, then every NMOS transistor has the same charge/discharge voltage$_{[0]}$, $V_{DS}$, which results in equivalent voltage transfer shapes of the input and output voltages of the NMOS transistors, that results in the equivalent duration of the outputted digital signals. The second embodiment releases the effect from the body effect in the first embodiment and also has advantages that same charge/discharge voltage$_{[0]}$, $V_{DS}$ can make the comparator circuit more independent from the variations of temperature. Moreover; it is much easier to layout the protocol of resistors with the same resistance.

Figure 5:
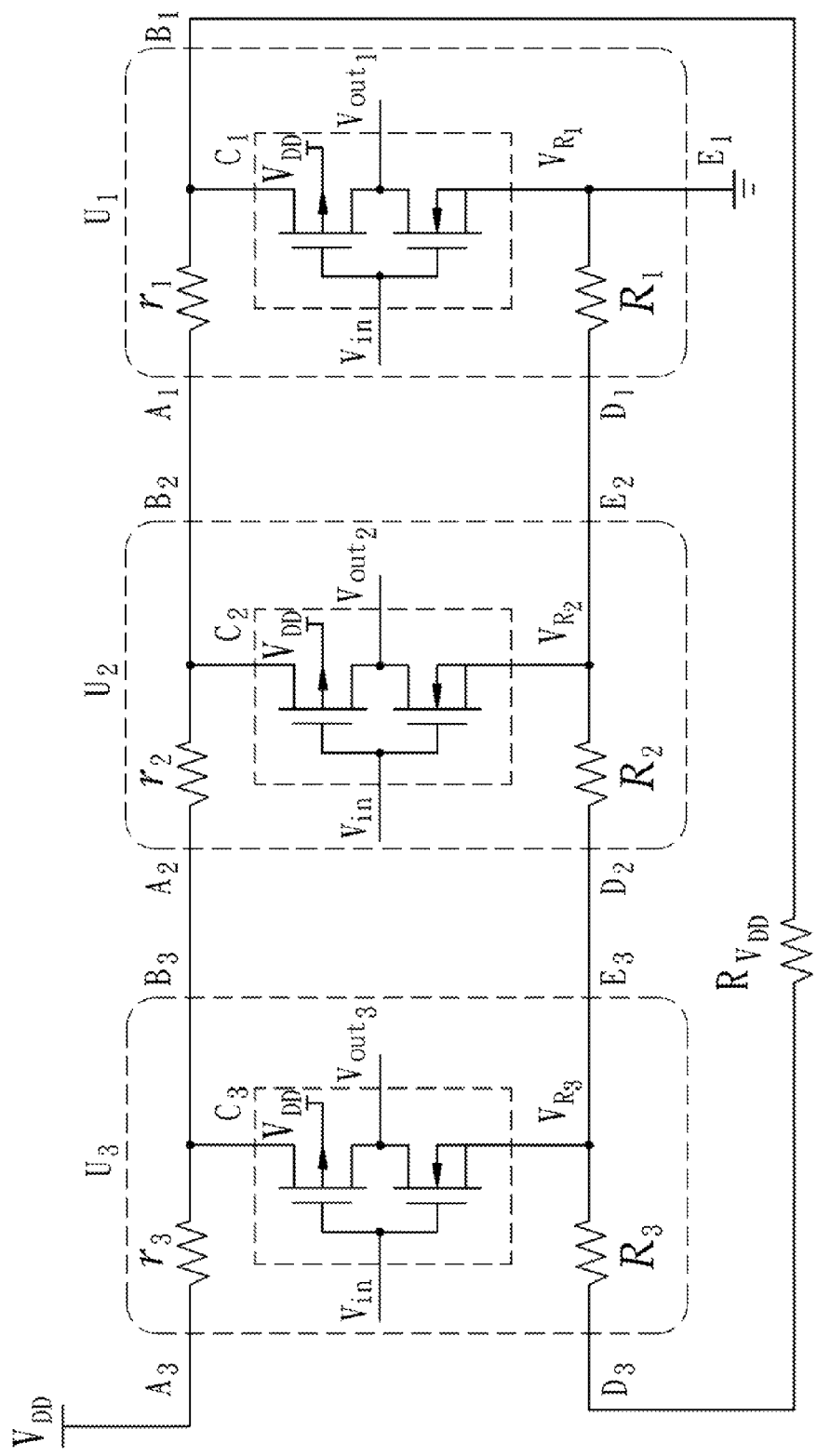
FIG. 5 is a schematic diagram of the comparing circuit unit in FIG. 4 when N=2.

FIG. 5 is a schematic diagram of the comparing circuit unit in FIG. 4 when N is taken to equal 2 as an example. From right to left, there are comparing circuit units $U_1 \sim U_2{}''_{-1}(U_1 \sim U_3)$, each of which generates digital signal with negative logic. $A_2$ port of $U_2$ connects with $B_3$ port of $U_3$, $B_2$ port of $U_2$ connects with $A_1$ port of $U_1$, $D_2$ port of $U_2$ connects with $E_3$ port of $U_3$, and $E_2$ port of $U_2$ connects with $D_1$ port of $U_1$.

More specifically, taking $C_1$ as an example, its signal input port is at the gate and utilized to receive the analog input signal $V_{in}$, its first level port is at the source of $N_1$ and connects with one end of the first resistor $R_1$ and ground to allow $N_1$ to receive the first level voltage $V_R$, provided by the first resistor $R_1$.

Further, taking $C_2$ as an example, its first level port at the source of $N_2$ connects with the other end of the first resistor $R_1$ of $C_1$. Similarly, the first resistor $R_3$ of the last unit connects with the power $V_{DD}$ through the $R_{VDD}$. Thus, the comparing circuit unit and ADC of the present invention are clearly disclosed in this specification.

It is noted that $R_3$ and $r_1$ can connect with a bias resistor $R_{VDD}$ in series to tune the source voltage $V_s$ of the NMOS transistor $N_3$ of the comparing circuit unit $U_3$ for different requirements.

According to the description provided above, the voltage switching point can be set up to the default optimum best value by fine tuning the source voltage of the NMOS transistors, such that good integrated non-linear (INL) and differential non-linear (DNL) values are realized.

Figure 6:
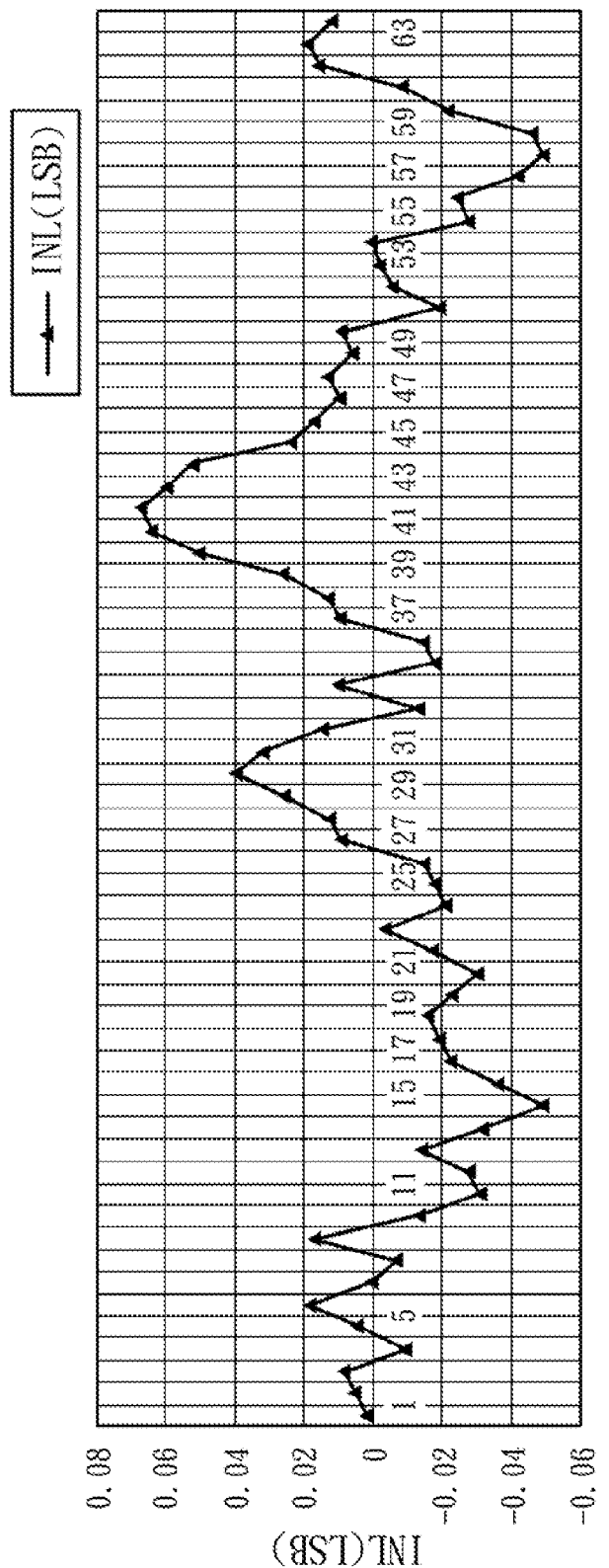
FIG. 6 is a graph showing simulated integrated non-linear (INL) values associated with the ADC of the present invention.
Figure 7:
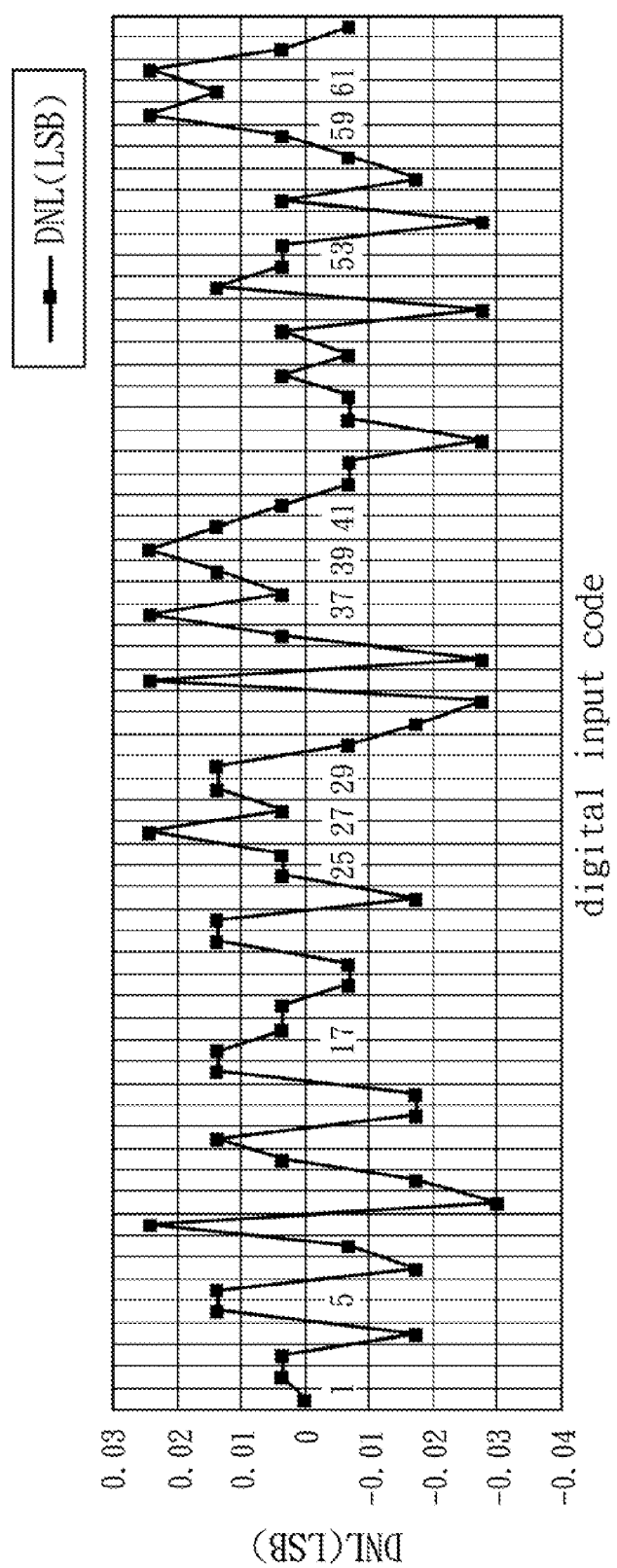
FIG. 7 is a graph showing simulated differential non-linear (DNL) values associated with the ADC of the present invention.

FIGS. 6-7 show simulated INL and DNL values, respectively, associated with the ADC of the present invention.

If the number of bits N is 6, and the techniques from TSMC 0.18 UM CMOS Mixed Signal RF General Purpose MiM Al 1P6M is used, $V_{DD}$ is 1.8 volts, and the simulated properties of the conventional ADC and those of the ADC of the to present invention are listed in Table 1.

TABLE 1

|  | frequency (MS/s) | power (mW) | INL (LSB) | DNL (LSB) |
|---|---|---|---|---|
| The conventional ADC | 1000 | 550 | 1.1 | 1 |
| The ADC of the present invention | >1000 | <1 | <0.1 | <0.05 |

The width/length ratio W/L of PMOS transistors $P_2{}''_{-1}$ and NMOS transistors $N_2{}''_{-1}$ in the comparing circuit unit $C_2{}''_{-1}$ can be fixed, such as the minimum in 180 nm techniques. Therefore, the ADC of the present invention can reduce the number of required transistors and its layout area.

In addition, it is clear that the number of required transistors of the ADC of the present invention is one-seventh the number required in the conventional ADC. In detail, 756 transistors are removed at N=6 by using the ADC of the present invention.

In summary, the ADC of the present invention decreases the number of the transistors and the layout area of the chip so that reduced cost, accurate control capability and power savings may be realized. The switching speed is high (>1000 MS/s) but the power consumption is relative low (<1 mW). In view of the performance of INL and DNL, the quantized error is also improved. The present invention achieves high speed, high resolution, a reduced number of transistors and smaller layout area, in addition to reduced cost, enhanced to power savings and improved heat dissipation.

Although the present invention has been described in considerable detail with reference to certain embodiments thereof, other embodiments are possible. Therefore, the spirit and scope of the appended claims should not be limited to the description of the embodiments contained herein.

What is claimed is:

1. A comparing circuit unit for an analog-to-digital converter (ADC), the comparing circuit unit comprising:
a first resistor of which one end is electrically connected to a power source and the other end is used for providing a first level voltage;
a second resistor of which one end is electrically connected to the power source and the other end is used for providing a second level voltage; and
a CMOS transistor comprising a PMOS transistor and an NMOS transistor, wherein the base of the PMOS transistor is electrically connected to the power source and the base of the NMOS transistor is connected to the source of the NMOS transistor, and the CMOS transistor comprises:
a signal input port located at the gate of the CMOS transistor and utilized for receiving an analog signal;
a first level port located at the source of the NMOS transistor and utilized for receiving the first level voltage;
a second level port located at the source of the PMOS transistor and utilized for receiving the second level voltage; and
a signal output port located at the drain of the CMOS transistor and utilized for outputting a digital signal;
wherein the digital signal is generated based on results of comparing a gate-to-source voltage ($V_{GS}$) of the NMOS transistor with a threshold voltage of the NMOS transistor.

2. The comparing circuit unit of claim 1, wherein when the gate-to-source voltage ($V_{GS}$) of the NMOS transistor is greater than the threshold voltage of the NMOS transistor, the NMOS transistor is activated and a negative logic "1" of the digital signal is generated.

3. The comparing circuit unit of claim 1, wherein when the gate-to-source voltage ($V_{GS}$) of the NMOS transistor is smaller than the threshold voltage of the NMOS transistor, the NMOS transistor is cut off and a negative logic "0" of the digital signal is generated.

4. An analog-to-digital converter (ADC), comprising:
to an input signal interface for receiving an analog input signal;
a comparing circuit unit of claim 1; and
an output signal interface which is electrically connected to the output port of the comparing circuit unit and used for synthesizing the digital signal as a digital output signal;
wherein the absolute value of the first level voltage equals the absolute value of the source-to-base voltage $V_{SB}$ of the NMOS transistor, and a source voltage of the NMOS transistor is tunable by adjusting a resistance of the first resistor;
wherein the digital signal is generated based on results of comparing a gate-to-source voltage $V_{GS}$ of the NMOS transistor with the threshold voltage of the NMOS transistor.

5. The ADC of claim 4, wherein when the number of the bits of the digital output signal is N, the number of the comparing circuit units is $2^n-1$.

6. The ADC of claim 4 wherein when the gate-to-source voltage $V_{GS}$ of the NMOS transistor is greater than the threshold voltage of the NMOS transistor, the NMOS transistor is activated and a negative logic "1" of the digital signal is generated.

7. The ADC of claim 4, wherein when the gate-to-source voltage $V_{GS}$ of the NMOS transistor is smaller than the threshold voltage of the NMOS transistor, the NMOS transistor is cut off and a negative logic "0" of the digital signal is generated.

* * * * *